US012715303B2

(12) United States Patent
Hair et al.

(10) Patent No.: US 12,715,303 B2
(45) Date of Patent: Aug. 25, 2026

(54) CONTROL OF GATE DRIVE RESISTANCE BASED ON RADIO FREQUENCY INTERFERENCE

(71) Applicant: Ford Global Technologies, LLC, Dearborn, MI (US)

(72) Inventors: Jonathan Hair, Royal Oak, MI (US); Jukkrit Noppakunkajorn, Novi, MI (US); Amir Shahidi, Seattle, WA (US); Brendan F. Diamond, Grosse Pointe, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 801 days.

(21) Appl. No.: 17/840,387

(22) Filed: Jun. 14, 2022

(65) Prior Publication Data

US 2023/0398878 A1 Dec. 14, 2023

(51) Int. Cl.
*B60L 53/20* (2019.01)
*B60L 15/00* (2006.01)
(Continued)

(52) U.S. Cl.
CPC ............... *B60L 15/00* (2013.01); *B60L 53/20* (2019.02); *H03K 17/567* (2013.01); *H04L 43/0829* (2013.01)

(58) Field of Classification Search
CPC .. H02M 3/1582; H02M 3/1584; H02M 3/285; H02M 3/33561; H02M 7/49; H02M 1/045; H02M 7/006; H02M 7/06; H02M 7/068; H02M 7/153; H02M 7/10; H02M 1/088; H02M 7/103; H02M 7/106; H02M 7/19; H02M 7/08; H02M 7/17; H02M 2001/007; H02M 7/493; H02M 7/53806; H02M 7/5381; H02M 7/483; H02M 7/217; H02M 7/538466; H02M 7/5387; H02M 7/53871; H02M 7/53873; H02M 7/53875; H02M 1/084; H02M 1/0845; H02M 3/073; H02M 3/10; H02M 3/135; H02M 3/137; H02M 3/28; H02M 3/315; H02M 3/3155; H02M 3/325; H02M 3/335; H02M 7/515; H02M 7/521; H02M 7/53; H02M 7/537; H02M 7/5383; H02M 7/53862; H02M 7/757; H02M 7/79; H02M 3/337;
(Continued)

(56) References Cited

U.S. PATENT DOCUMENTS 4,037,188 A * 7/1977 Frey ...................... H01C 10/34
338/162
9,960,692 B2 5/2018 Iorio et al.
(Continued)

FOREIGN PATENT DOCUMENTS

CN 106160446 B 10/2018
JP 5938852 B2 6/2016

*Primary Examiner* — Crystal L Hammond
*Assistant Examiner* — Nusrat Quddus
(74) *Attorney, Agent, or Firm* — David B. Kelley; Brooks Kushman P.C.

(57) ABSTRACT

An automotive vehicle includes an electric machine, a power converter that powers the electric machine and includes a switch having an adjustable gate drive resistance, a source of audio, and a controller that varies the gate drive resistance according to a received signal strength associated with the source of audio.

20 Claims, 3 Drawing Sheets

(51) Int. Cl.
*H03K 17/567* (2006.01)
*H04L 43/0829* (2022.01)

(58) Field of Classification Search
CPC .. H02M 3/338; H02M 3/3382; H02M 3/3384; H02M 7/538; H02M 7/53832; H02M 7/53835; H02M 7/487; H02M 7/539; H02M 7/23; H02M 7/21; H02M 7/12; H02M 7/04; H02M 7/00; H02J 3/46; H02J 3/38
See application file for complete search history.

(56) References Cited

U.S. PATENT DOCUMENTS

| | | | | |
|---|---|---|---|---|
| 10,071,652 | B2* | 9/2018 | Lu | B60L 15/20 |
| 10,432,186 | B2* | 10/2019 | Yang | B60R 16/005 |
| 11,133,796 | B2 | 9/2021 | Xu et al. | |
| 11,929,688 | B2* | 3/2024 | Makhoul | H02M 7/4815 |
| 2006/0284671 | A1* | 12/2006 | Ohba | H03F 3/45977 330/9 |
| 2010/0069020 | A1* | 3/2010 | Koya | H03K 17/687 327/306 |
| 2016/0070277 | A1* | 3/2016 | Price | G05F 1/46 324/123 R |
| 2016/0294275 | A1* | 10/2016 | Pronovost | H02M 1/08 |
| 2017/0222641 | A1 | 8/2017 | Zou et al. | |
| 2017/0288657 | A1* | 10/2017 | Yanagi | H10D 30/66 |
| 2018/0056795 | A1* | 3/2018 | Xu | H03K 17/567 |
| 2019/0123546 | A1* | 4/2019 | Wang | H02H 7/122 |
| 2020/0205078 | A1* | 6/2020 | Balmelli | H04W 52/0235 |

* cited by examiner

CONTROL OF GATE DRIVE RESISTANCE BASED ON RADIO FREQUENCY INTERFERENCE

TECHNICAL FIELD

This disclosure relates to automotive power systems.

BACKGROUND

Vehicles may include various electronic equipment to facilitate propulsion (e.g., switch-based power converters) and provide entertainment services (e.g., radios). Electrical energy may be consumed by this electronic equipment.

SUMMARY

An automotive power system includes a power converter that provides power to an electric machine and has a switch with a gate drive resistance, and a controller that alters the gate drive resistance according to a volume of a radio such that as the volume changes the gate drive resistance changes. The controller may further alter the gate drive resistance according to data indicative of packet loss associated with wireless communications such that as the packet loss changes the gate drive resistance changes, alter the gate drive resistance according to a received signal strength associated with the radio such that as the received signal strength changes the gate drive resistance changes, alter the gate drive resistance according to a torque or speed of the electric machine, alter the gate drive resistance according to a tuned frequency of the radio, and/or alter the gate drive resistance using feedback control and data indicative of a level of emissions interference associated with the gate drive resistance. The power converter may be an inverter.

A method includes varying a gate drive resistance of a switch on an automotive power converter that is arranged to provide power to an electric machine of a vehicle according to data indicative of packet loss associated with wireless communications of the vehicle. The method may further include varying the gate drive resistance according to a volume of a radio of the vehicle, varying the gate drive resistance according to a received signal strength associated with a radio of the vehicle, varying the gate drive resistance according to a torque or speed of the electric machine, varying the gate drive resistance according to a tuned frequency of a radio of the vehicle, and/or varying the gate drive resistance using feedback control and data indicative of a level of emissions interference associated with the gate drive resistance. The automotive power converter may be an inverter.

A vehicle includes an electric machine, a power converter that powers the electric machine and has a switch with a gate drive resistance, a radio, and a controller that varies the gate drive resistance according to a received signal strength associated with the radio. The controller may further vary the gate drive resistance according to a volume of the radio, vary the gate drive resistance according to data indicative of packet loss associated with wireless communications of the vehicle, vary the gate drive resistance according to a torque or speed of the electric machine, and/or vary the gate drive resistance according to a tuned frequency of the radio. The power converter may be an inverter.

DETAILED DESCRIPTION

Figure 1:
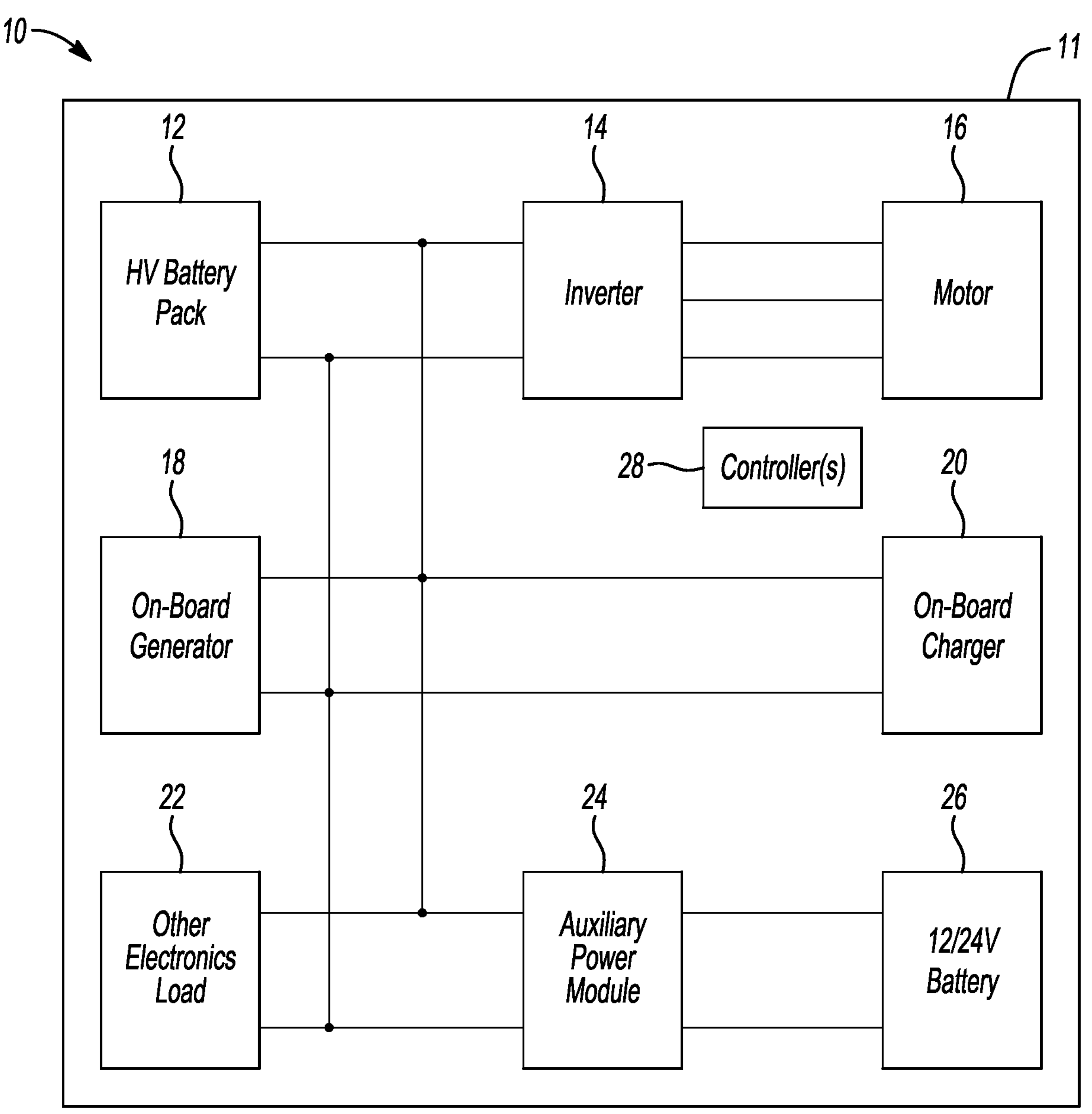
FIG. 1 is a block diagram of a high voltage power system of an electric vehicle.

Embodiments are described herein. It is to be understood, however, that the disclosed embodiments are merely examples and other embodiments may take various and alternative forms. The figures are not necessarily to scale. Some features could be exaggerated or minimized to show details of particular components. Therefore, specific structural and functional details disclosed herein are not to be interpreted as limiting, but merely as a representative basis for teaching one skilled in the art.

Various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Electrified vehicles (e.g., battery electric vehicles, hybrid vehicles, etc.) can emit electromagnetic interference or radio frequency interference that can affect radio equipment and various digital communication equipment. AM radio and some police radio reception, for example, may be susceptible to interference. Shielding and external antennas can be used to increase reception. These solutions may add expense, and in the case of external antennas, add drag.

Gate drive resistors may be designed to reduce the slew rate of the corresponding switching device. Inverter losses, however, may increase as a result, which may translate into a reduction in fuel economy. The resistance associated with the gate driver circuit determines the speed at which certain transistors (e.g., insulated-gate bipolar transistors (IGBTs), metal-oxide-semiconductor field-effect transistors (MOSFETs), etc.) transition state. A lower gate drive resistance typically leads to faster current transitions when the transistor switches. Faster transitions produce more harmonic content at higher frequencies, as can be discerned from a Fourier transform of a square wave. High frequency harmonic content is what produces the radio frequency interference. Increased gate drive resistance reduces the radio frequency interference emissions, but can have an effect on switching loss and increase the dwell time of motor controls, further increasing losses and harmonics. Selecting the gate drive resistance can typically involve a balancing of these effects.

An approach to manage the above is to have a gate drive resistance that can be actively varied to prioritize switching performance or low radio frequency interference depending on several input factors and closed loop control feedback. The gate drive characteristics could be changed based on inputs such as (i) the source of audio being played (e.g., AM, FM, Satellite, Internet, police radio, CB radio, HAM radio) such that if an audio or communication source is being used that is not affected by the normal operating mode/gate driver resistance generated electromagnetic interference, the optimal/normal gate driver resistance can be used, (ii) the received signal strength indication of the police radio, the AM radio, or the FM radio, (iii) the packet loss in digital wireless communications (e.g., Bluetooth, cellular, etc.), (iv) the drive mode (e.g., economy, sport, etc.), (v) the electric motor torque and/or speed, (vi) the radio volume, and/or (vii) the radio frequency (e.g., if radio source is tuned to less than a 100 kHz frequency). The gate drive resistance can be varied through a dedicated integrated circuit with a digital input. Gate drive resistance can be added as a calibration parameter in corresponding controls. The control may optimize the gate driver performance to achieve acceptable radio reception for the best efficiency.

Referring to FIG. 1, a high voltage power system 10 for a battery-based electric vehicle 11 includes a high voltage battery pack 12, an inverter 14, a motor 16, an on-board generator 18, an on-board charger 20, other electronic loads 22, an auxiliary power module 24, an auxiliary battery 26, and one or more controllers 28. The high voltage battery pack 12 provides energy to drive the vehicle 11 through the inverter 14 and traction motor 16. The on-board generator 18 converts DC electricity into AC power for customers. The on-board charger 20 performs high voltage battery charging. The auxiliary power module 24 provides charging for the auxiliary battery 26. The other electronic loads 22, such as electric air conditioning, share a common high voltage DC bus having a voltage typically around 400V DC. The controllers 28 are in communication with and/or exert control over the above mentioned components. This is but one possible power system configuration. Others are also contemplated including hybrid configurations, etc.

Figure 2:
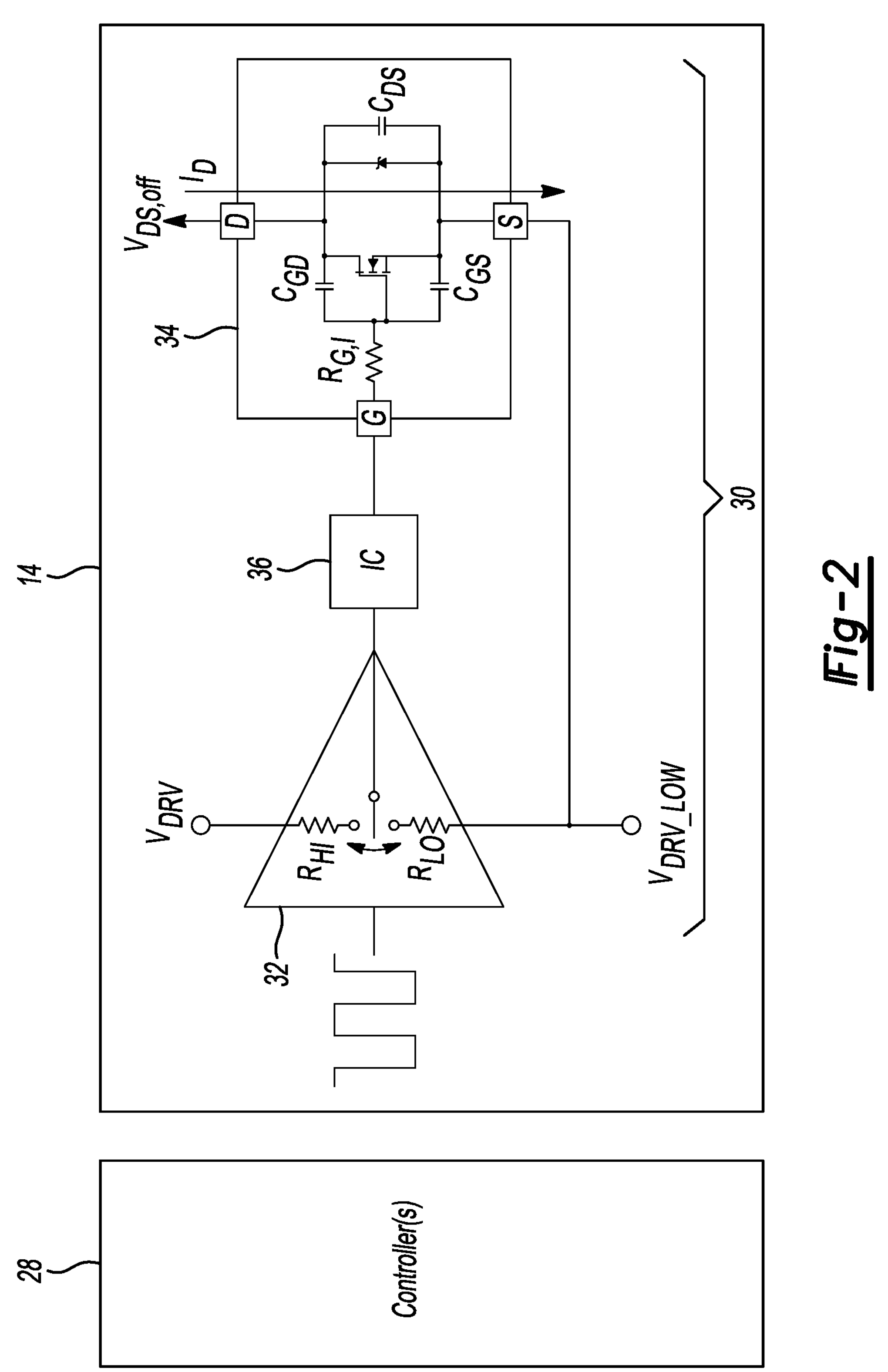
FIG. 2 is a block diagram of the inverter and controllers of FIG. 1.

Referring to FIG. 2, the inverter 14 may include a plurality of switches 30 (e.g., MOSFETs) arranged with respect to one another in usual fashion. Other switch types (e.g., IGBTs, etc.) may, of course, also be used. The inverter 14, for example, may have pairs of the switches 30 electrically connected in series and configured to transform AC power to DC power or vice versa as known in the art. For clarity, only one of the switches 30 is shown. Each of the switches 30 in this example includes a driver 32, a switching device 34 with a gate G, a drain D, and a source S, and an integrated circuit 36 with a digital input. The integrated circuit 36 is electrically connected between on output of the driver 32 and the gate G. The driver 32, as the name suggests, drives a voltage to the gate G through the integrated circuit 36. Command signals to the driver 32 may originate from the controllers 28 and depend on power requirements of the motor 16.

The integrated circuit 36 is configured to present an adjustable resistance to signals from the driver 32 travelling therethrough to the gate G. The controllers 28 can change this adjustable resistance via the digital input. Other arrangements to adjust the resistance and communication schemes are also contemplated. Several integrated circuits, instead of the single integrated circuit 36, may be used to vary the off and on series gate resistance independently. Any suitable components for implementing such an adjustable resistance, however, may be used. Depending on various circumstances, the controllers 28 may command the integrated circuit 36 to increase its resistance, which would decrease the rate at which the switching device 34 could change state and reduce the radio frequency interference produced by operation thereof. The controllers 28 may also command the integrated circuit to decrease its resistance, which would increase the rate at which the switching device 34 could change state and increase the radio frequency interference produced by operation thereof. These different scenarios may be preferred depending on the situation.

The controllers 28 may command the integrated circuit 36, with signals separate from those to the driver 32, to set its resistance to one of a number of predefined values that are determined via simulation or testing according to the presence or absence of certain conditions. A number of inputs as mentioned above can be considered when determining the desired gate drive resistance: source of audio, received signal strength, packet loss, drive mode, electric motor torque and/or speed, radio volume, radio frequency, etc. For a given vehicle configuration, trials can be run to assess the effect the various inputs have—alone and in combinations—on the interference emissions. A corresponding desired gate drive resistance can be developed for each scenario. Thus, if the vehicle 11 is operating in an economy mode (i.e., a mode that attempts to maximize the distance travelled for a given amount of energy consumed) with the radio tuned to an FM station at a particular volume, the controllers 28 may command the integrated circuit 36 to set its resistance to a particular value. If the vehicle 11 is receiving wireless communications and the packet loss (as detected in usual fashion) is above some predefined threshold, the controllers 28 may command the integrated circuit 36 to set its resistance to another particular value. If the vehicle 11 is operating in a performance mode (i.e., a mode in which responsiveness of the powertrain is prioritized), tuning of the gate drive resistance may be precluded as the inverter 14 may need to exhibit best performance, and so on depending on conditions. A look-up table, for example, may be used to link the various conditions with the various predefined values for gate drive resistance. Once the controllers 28 detect the relevant conditions present using standard sensing techniques, it may consult the table for the appropriate value. Other techniques, however, are also contemplated.

The controllers 28 may also use feedback control to vary the resistance of the integrated circuit 36. In circumstances in which data indicating the level of interference emissions being generated is available, the controllers 28 may command the integrated circuit 36 to increase or decrease its resistance accordingly to achieve some target level of interference emissions being generated. The data may be generated from known sensors directly or indirectly measuring interference emissions (e.g., packet loss can be an indirect measure of interference emissions, as well as other parameters that may correspond to interference emissions, etc.), and the target level may depend on the various inputs mentioned above; under certain circumstances the target level may be lower, under others the target may be higher. Simulation and/or testing can be used to establish the desired levels. Tests may be run, for example, to determine what level of interference emissions is acceptable as the volume of an audio source tuned to an FM station changes. Tests may also be run to determine what level of interference emissions is acceptable as the received signal strength for an audio source changes. Increased levels of interference emissions, for example, may be more tolerable the stronger the received signal strength for the audio source.

Figure 3:
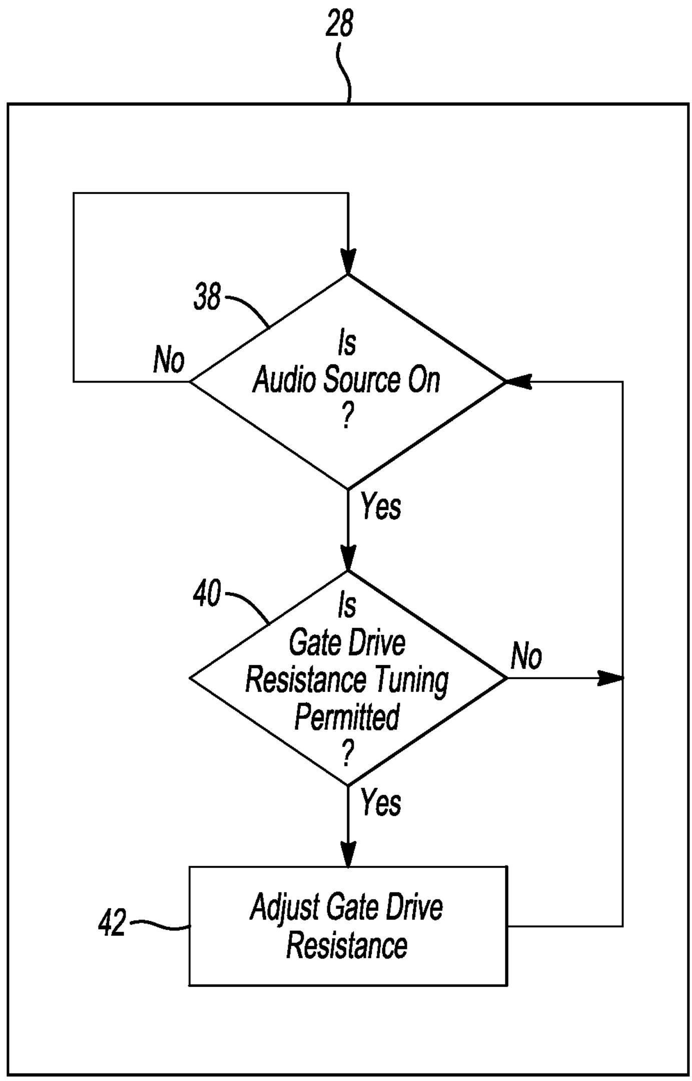
FIG. 3 is a flow chart of an algorithm for varying the gate drive resistance of a switching device.

Referring to FIG. 3, the controllers 28 may implement the above strategies in the form of an algorithm. At operation 38, the controllers 28 determine whether an audio source (e.g., a radio, etc.) is on. Power being supplied to a radio, for example, would indicate the radio is on. If no audio source is on, the algorithm returns to operation 38 as no gate drive resistance tuning is needed. Default resistance values may be sufficient as effects of interference emissions may not be apparent. If an audio source is on, the controllers 28 determine whether gate drive resistance tuning is permitted at operation 40. Resistance tuning, for example, may be precluded when the vehicle 11 is operating in a performance mode. There may also be other circumstances that manufacturers identify in which resistance tuning may not be desirable. If resistance tuning is permitted, the controllers 28 adjust the gate drive resistance at operation 42. The controllers 28, for example, may specify a target gate drive resistance based on conditions or use feedback control to achieve an interference emissions target as described above. The algorithm then returns to operation 38.

The algorithms, methods, or processes disclosed herein can be deliverable to or implemented by a computer, controller, or processing device, which can include any dedicated electronic control unit or programmable electronic control unit. Similarly, the algorithms, methods, or processes can be stored as data and instructions executable by a computer or controller in many forms including, but not limited to, information permanently stored on non-writable storage media such as read only memory devices and information alterably stored on writeable storage media such as compact discs, random access memory devices, or other magnetic and optical media. The algorithms, methods, or processes can also be implemented in software executable objects. Alternatively, the algorithms, methods, or processes can be embodied in whole or in part using suitable hardware components, such as application specific integrated circuits, field-programmable gate arrays, state machines, or other hardware components or devices, or a combination of firmware, hardware, and software components.

While exemplary embodiments are described above, it is not intended that these embodiments describe all possible forms encompassed by the claims. Power converters other than inverters, for example, may also implement the concepts described herein. Moreover, the words used in the specification are words of description rather than limitation, and it is understood that various changes may be made without departing from the spirit and scope of the disclosure. The words controller and controllers as well as processor and processors may be interchanged herein. Thus, the operations described may be performed by a single controller or processor, or coordinated between several controllers or processors.

As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to strength, durability, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. An automotive power system comprising:

a power converter configured to provide power to an electric machine and including a switch having a gate drive resistance; and a controller programmed to alter the gate drive resistance according to a volume of a radio such that as the volume changes the gate drive resistance changes.

2. The automotive power system of claim 1, wherein the controller is further programmed to alter the gate drive resistance according to data indicative of packet loss associated with wireless communications such that as the packet loss changes the gate drive resistance changes.

3. The automotive power system of claim 1, wherein the controller is further programmed to alter the gate drive resistance according to a received signal strength associated with the radio such that as the received signal strength changes the gate drive resistance changes.

4. The automotive power system of claim 1, wherein the controller is further programmed to alter the gate drive resistance according to a torque or speed of the electric machine.

5. The automotive power system of claim 1, wherein the controller is further programmed to alter the gate drive resistance according to a tuned frequency of the radio.

6. The automotive power system of claim 1, wherein the controller is further configured to alter the gate drive resistance using feedback control and data indicative of a level of emissions interference associated with the gate drive resistance.

7. The automotive power system of claim 1, wherein the power converter is an inverter.

8. A method comprising:

varying a gate drive resistance of a switch on an automotive power converter that is arranged to provide power to an electric machine of a vehicle according to data indicative of packet loss associated with wireless communications of the vehicle.

9. The method of claim 8 further comprising varying the gate drive resistance according to a volume of a radio of the vehicle.

10. The method of claim 8 further comprising varying the gate drive resistance according to a received signal strength associated with a radio of the vehicle.

11. The method of claim 8 further comprising varying the gate drive resistance according to a torque or speed of the electric machine.

12. The method of claim 8 further comprising varying the gate drive resistance according to a tuned frequency of a radio of the vehicle.

13. The method of claim 8 further comprising varying the gate drive resistance using feedback control and data indicative of a level of emissions interference associated with the gate drive resistance.

14. The method of claim 8, wherein the automotive power converter is an inverter.

15. A vehicle comprising:

an electric machine;

a power converter configured to power the electric machine and including a switch having a gate drive resistance;

a radio; and a controller programmed to vary the gate drive resistance according to a received signal strength associated with the radio.

16. The vehicle of claim 15, wherein the controller is further programmed to vary the gate drive resistance according to a volume of the radio.

17. The vehicle of claim 15, wherein the controller is further programmed to vary the gate drive resistance according to data indicative of packet loss associated with wireless communications of the vehicle.

18. The vehicle of claim 15, wherein the controller is further programmed to vary the gate drive resistance according to a torque or speed of the electric machine.

19. The vehicle of claim 15, wherein the controller is further programmed to vary the gate drive resistance according to a tuned frequency of the radio.

20. The vehicle of claim 15, wherein the power converter is an inverter.

* * * * *